United States Patent
Park et al.

(10) Patent No.: US 11,683,975 B2
(45) Date of Patent: Jun. 20, 2023

(54) ETCHANT COMPOSITION AND METHOD OF MANUFACTURING DISPLAY APPARATUS BY USING THE SAME

(71) Applicant: Samsung Display Co., Ltd., Yongin-si (KR)

(72) Inventors: Jonghee Park, Yongin-si (KR); Jinseock Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 127 days.

(21) Appl. No.: 16/953,047

(22) Filed: Nov. 19, 2020

(65) Prior Publication Data

US 2021/0343944 A1 Nov. 4, 2021

(30) Foreign Application Priority Data

Apr. 29, 2020 (KR) .................. 10-2020-0052900

(51) Int. Cl.
*H01L 51/00* (2006.01)
*C09K 13/06* (2006.01)
*H01L 27/32* (2006.01)
*H01L 51/52* (2006.01)
*H01L 51/56* (2006.01)

(52) U.S. Cl.
CPC .......... *H01L 51/0017* (2013.01); *C09K 13/06* (2013.01); *H01L 27/3244* (2013.01); *H01L 51/5215* (2013.01); *H01L 51/56* (2013.01); *H01L 2227/323* (2013.01); *H01L 2251/301* (2013.01)

(58) Field of Classification Search
CPC .............. H01L 51/0017; H01L 27/3244; H01L 51/5215; H01L 51/56; H01L 2227/323; H01L 2251/301; H01L 21/32134; H01L 21/465; H01L 27/1259; H01L 51/0023; H01L 2227/32; C09K 13/06; C23F 1/30; C23F 1/02; C23F 1/20; C23F 1/26
USPC .................................................. 216/79.3, 79.4
See application file for complete search history.

(56) References Cited

U.S. PATENT DOCUMENTS

| | | | |
|---|---|---|---|
| 7,141,180 B2 | 11/2006 | Park et al. | |
| 7,357,878 B2 | 4/2008 | Park et al. | |
| 8,366,958 B2 | 2/2013 | Chung et al. | |
| 8,455,310 B2 | 6/2013 | Yim | |
| 8,785,224 B2 | 7/2014 | Ko et al. | |
| 10,023,797 B2 | 7/2018 | Shigeta et al. | |

(Continued)

FOREIGN PATENT DOCUMENTS

| | | |
|---|---|---|
| CN | 110644003 A | 1/2020 |
| JP | 4756069 B2 | 8/2011 |

(Continued)

OTHER PUBLICATIONS

European Search Report for Patent Application No. 21171001.7, dated Sep. 23, 2021, 9 pages.

*Primary Examiner* — Duy Vu N Deo
(74) *Attorney, Agent, or Firm* — Lewis Roca Rothgerber Christie LLP

(57) ABSTRACT

An etchant composition includes an inorganic acid compound of about 8 wt % to about 15 wt %, a sulfonic acid compound of about 2.5 wt % to about 8 wt %, a sulfate compound of about 6 wt % to about 14 wt %, an organic acid compound of about 40 wt % to about 55 wt %, a metal or metal salt of about 0.01 wt % to about 0.06 wt %, and water.

26 Claims, 11 Drawing Sheets

(56) References Cited

U.S. PATENT DOCUMENTS

| | | | |
|---|---|---|---|
| 10,611,962 B2 | 4/2020 | Park et al. | |
| 2019/0153318 A1* | 5/2019 | Park | H01L 51/5234 |
| 2020/0115631 A1* | 4/2020 | Park | H01L 21/28 |

FOREIGN PATENT DOCUMENTS

| | | | | |
|---|---|---|---|---|
| JP | 5158339 B2 | 3/2013 | | |
| KR | 10-0712879 B1 | 4/2007 | | |
| KR | 10-0853216 B1 | 8/2008 | | |
| KR | 10-0993775 B1 | 11/2010 | | |
| KR | 10-2014-0048045 A | 4/2014 | | |
| KR | 10-2014-0063283 A | 5/2014 | | |
| KR | 10-2014-0063284 A | 5/2014 | | |
| KR | 10-1391603 B1 | 5/2014 | | |
| KR | 10-1459502 B1 | 11/2014 | | |
| KR | 10-1518055 A | 5/2015 | | |
| KR | 10-2016-0100591 A | 8/2016 | | |
| KR | 20160099918 A | * | 8/2016 | H01L 29/786 |
| KR | 10-2016-0122715 A | 10/2016 | | |
| KR | 10-1695608 B1 | 1/2017 | | |
| KR | 10-1905195 B1 | 10/2018 | | |
| KR | 10-2019-0058758 A | 5/2019 | | |
| KR | 10-2019-0058759 A | 5/2019 | | |
| KR | 20190111658 A | 10/2019 | | |
| KR | 10-2019-0123377 A | 11/2019 | | |

* cited by examiner

ETCHANT COMPOSITION AND METHOD OF MANUFACTURING DISPLAY APPARATUS BY USING THE SAME

CROSS-REFERENCE TO RELATED APPLICATION

This application claims priority to and the benefit of Korean Patent Application No. 10-2020-0052900, filed on Apr. 29, 2020, in the Korean Intellectual Property Office (KIPO), the entire disclosure of which is incorporated herein by reference.

BACKGROUND

1. Field

One or more embodiments relate to an etchant composition and a method of manufacturing a display apparatus by using the same, and more particularly, to an etchant composition having improved reliability and a method of manufacturing a display apparatus by using the same.

2. Description of Related Art

With the development of the display field representing various electrical signal information, various flat panel display apparatuses having excellent characteristics such as slimness, lightweight, and low power consumption have been researched and developed. Among them, organic light emitting display apparatuses have attracted attention as next-generation display apparatuses due to their advantages such as wide viewing angle and fast response time as well as lightweight and slimness.

Moreover, as the display area of display apparatuses gradually increases, various lines and electrodes included in the display apparatuses may be formed of a material having low resistivity.

SUMMARY

Aspects of one or more embodiments are directed towards an etchant composition capable of etching a multi-layer structure including silver and a method of manufacturing a display apparatus by using the etchant composition. However, these problems are merely examples and the scope of the present disclosure is not limited thereto.

Additional aspects will be set forth in part in the description which follows and, in part, will be apparent from the description, or may be learned by practice of the presented embodiments.

According to one or more embodiments, an etchant composition includes an inorganic acid compound of about 8 wt % to about 15 wt %, a sulfonic acid compound of about 2.5 wt % to about 8 wt %, a sulfate compound of about 6 wt % to about 14 wt %, an organic acid compound of about 40 wt % to about 55 wt %, a metal or metal salt of about 0.01 wt % to about 0.06 wt %, and water.

In the present embodiments, the inorganic acid compound may include a nitric acid.

In the present embodiments, the sulfonic acid compound may include at least one of a methanesulfonic acid, an ethanesulfonic acid, or a propanesulfonic acid.

In the present embodiments, the sulfate compound may include at least one of a potassium hydrogen sulfate, a sodium hydrogen sulfate, or an ammonium hydrogen sulfate.

In the present embodiments, the organic acid compound may include at least one of an acetic acid, a citric acid, a glycolic acid, a malonic acid, a lactic acid, or a tartaric acid.

In the present embodiments, the metal or metal salt may include at least one of a ferric nitrate, a ferric sulfate, a copper, a copper sulfate, or an iron.

In the present embodiments, a wt % ratio of the sulfate compound to the organic acid compound may be about 1:4 to about 1:5.

In the present embodiments, the water may be about 28 wt % to about 30 wt %.

According to one or more embodiments, a method of manufacturing a display apparatus including a display area and a non-display area, the method includes forming a thin film transistor on a substrate of the display area, forming a planarization layer on the thin film transistor, forming an electrode layer on the planarization layer, and forming a pixel electrode by etching the electrode layer with an etchant composition, wherein the etchant composition includes an inorganic acid compound of about 8 wt % to about 15 wt %, a sulfonic acid compound of about 2.5 wt % to about 8 wt %, a sulfate compound of about 6 wt % to about 14 wt %, an organic acid compound of about 40 wt % to about 55 wt %, a metal or metal salt of about 0.01 wt % to about 0.06 wt %, and water.

In the present embodiments, the electrode layer may be formed as a multi-layer structure.

In the present embodiments, the electrode layer may include a first conductive layer, a second conductive layer including a first metal, and a third conductive layer. The first conductive layer and the third conductive layer may be transparent or semitransparent electrodes.

In the present embodiments, the first metal may be silver.

In the present embodiments, the etchant composition may be used to etch the first conductive layer, the second conductive layer, and the third conductive layer.

In the present embodiments, the etchant composition may be used to etch the first conductive layer and the second conductive layer.

In the present embodiments, the method may further include forming a line layer in the non-display area, wherein the electrode layer may be etched by the etchant composition with the line layer exposed.

In the present embodiments, the line layer may include a first line layer including a second metal, a second line layer including a third metal, and a third line layer including the second metal.

In the present embodiments, the second metal may be titanium, and the third metal may be aluminum.

In the present embodiments, the thin film transistor may include a semiconductor layer, a gate electrode, a source electrode, and a drain electrode, and the line layer may be formed of the same material as the source electrode or the drain electrode.

In the present embodiments, the method may further include forming an intermediate layer on the pixel electrode and an opposite electrode on the intermediate layer.

In the present embodiments, the inorganic acid compound may include a nitric acid.

In the present embodiments, the sulfonic acid compound may include at least one of a methanesulfonic acid, an ethanesulfonic acid, or a propanesulfonic acid.

In the present embodiments, the sulfate compound may include at least one of a potassium hydrogen sulfate, a sodium hydrogen sulfate, or an ammonium hydrogen sulfate.

In the present embodiments, the organic acid compound may include at least one of an acetic acid, a citric acid, a glycolic acid, a malonic acid, a lactic acid, or a tartaric acid.

In the present embodiments, the metal or metal salt may include at least one of a ferric nitrate, a ferric sulfate, a copper, a copper sulfate, or an iron.

In the present embodiments, a wt % ratio of the sulfate compound to the organic acid compound may be about 1:4 to about 1:5.

In the present embodiments, the water may be about 28 wt % to about 30 wt %.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
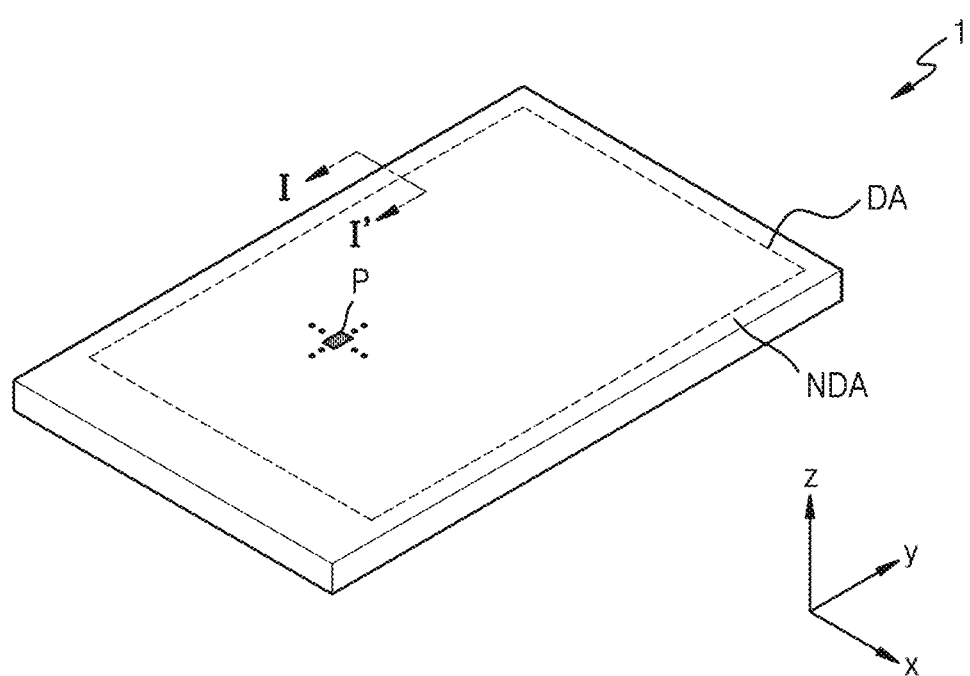
FIG. 1 is a perspective view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

The present disclosure may include various embodiments and modifications, and certain embodiments thereof are illustrated in the drawings and will be described herein in detail. The effects and features of the present disclosure and the accomplishing methods thereof will become apparent from the embodiments described below in detail with reference to the accompanying drawings. However, the present disclosure is not limited to the embodiments described below and may be embodied in various modes.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the present disclosure is not limited thereto.

As used herein, "A and/or B" represents the case of A, B, or A and B. In the following embodiments, a line "extending in a first direction or a second direction" may include not only extending in a linear shape but also extending in a zigzag or curved shape along the first direction or the second direction.

In the following embodiments, when referred to as "in a plan view," it may mean that a target portion is viewed from above, and when referred to as "in a cross-sectional view," it may mean that a cross-section of a target portion vertically cut is viewed from side. In the following embodiments, when referred to as "overlapping," it may include overlapping "in a plan view" and overlapping "in a cross-sectional view."

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the use of "may" when describing embodiments of the present disclosure refers to "one or more embodiments of the present disclosure". As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in detail with reference to the accompanying drawings, and in the following description, like reference numerals will denote like elements.

FIG. 1 is a perspective view schematically illustrating a display apparatus according to an embodiment.

Referring to FIG. 1, a display apparatus 1 may include a display area DA and a non-display area NDA arranged around the display area DA. The non-display area NDA may surround the display area DA. The display apparatus 1 may provide an image by using light emitted from a plurality of pixels P arranged in the display area DA, and the non-display area NDA may be an area where no image is displayed. For example, a plurality of pixels P may not be arranged in the non-display area NDA to provide an image.

Hereinafter, an organic light emitting display apparatus will be described as an example of the display apparatus 1 according to an embodiment. However, the display apparatus 1 of the present disclosure is not limited thereto. In an embodiment, the display apparatus 1 of the present disclosure may be an inorganic light emitting display apparatus (or an inorganic electroluminescence (EL) display apparatus) or may be another display apparatus 1 such as a quantum dot light emitting display apparatus. For example, an emission layer of a display element included in the display apparatus 1 may include an organic material, an inorganic material, quantum dots, an organic material and quantum dots, and/or an inorganic material and quantum dots.

Although FIG. 1 illustrates the display apparatus 1 having a flat display surface, the present disclosure is not limited thereto. In an embodiment, the display apparatus 1 may include a three-dimensional display surface or a curved display surface.

When the display apparatus 1 includes a three-dimensional display surface, the display apparatus 1 may include a plurality of display areas indicating different directions (e.g., display areas facing different directions) and may include, for example, a polygonal columnar display surface. In an embodiment, when the display apparatus 1 includes a curved display surface, the display apparatus 1 may be implemented (or provided) in various suitable forms such as flexible, foldable, and/or rollable forms corresponding to flexible, foldable, and/or rollable display apparatuses respectively.

FIG. 1 illustrates the display apparatus 1 that may be applied to a mobile phone terminal. However, the present disclosure is not limited thereto. For example, a mobile phone terminal may be constructed by arranging electronic modules, a camera module, a power module, and the like mounted on a main board, in a bracket/case or the like together with (e.g., housed with) the display apparatus 1. The display apparatus 1 according to the present disclosure may be applied to large electronic apparatuses (e.g., televisions or monitors) and small and medium electronic apparatuses (e.g., tablets, car navigations, game machines, or smart watches).

Although FIG. 1 illustrates a case where the display area DA of the display apparatus 1 is a tetragonal shape, the shape of the display area DA may be any suitable shape including, for example, circular, elliptical, or polygonal (e.g., triangular or pentagonal) shapes.

The display apparatus 1 may include a plurality of pixels P arranged in the display area DA. Each of the pixels P may include an organic light emitting diode OLED. Each pixel P may emit, for example, red, green, blue, or white light from the organic light emitting diode OLED. As used herein, the "pixel P" may be understood as a pixel emitting any one of red light, green light, blue light, and white light.

Figure 2:
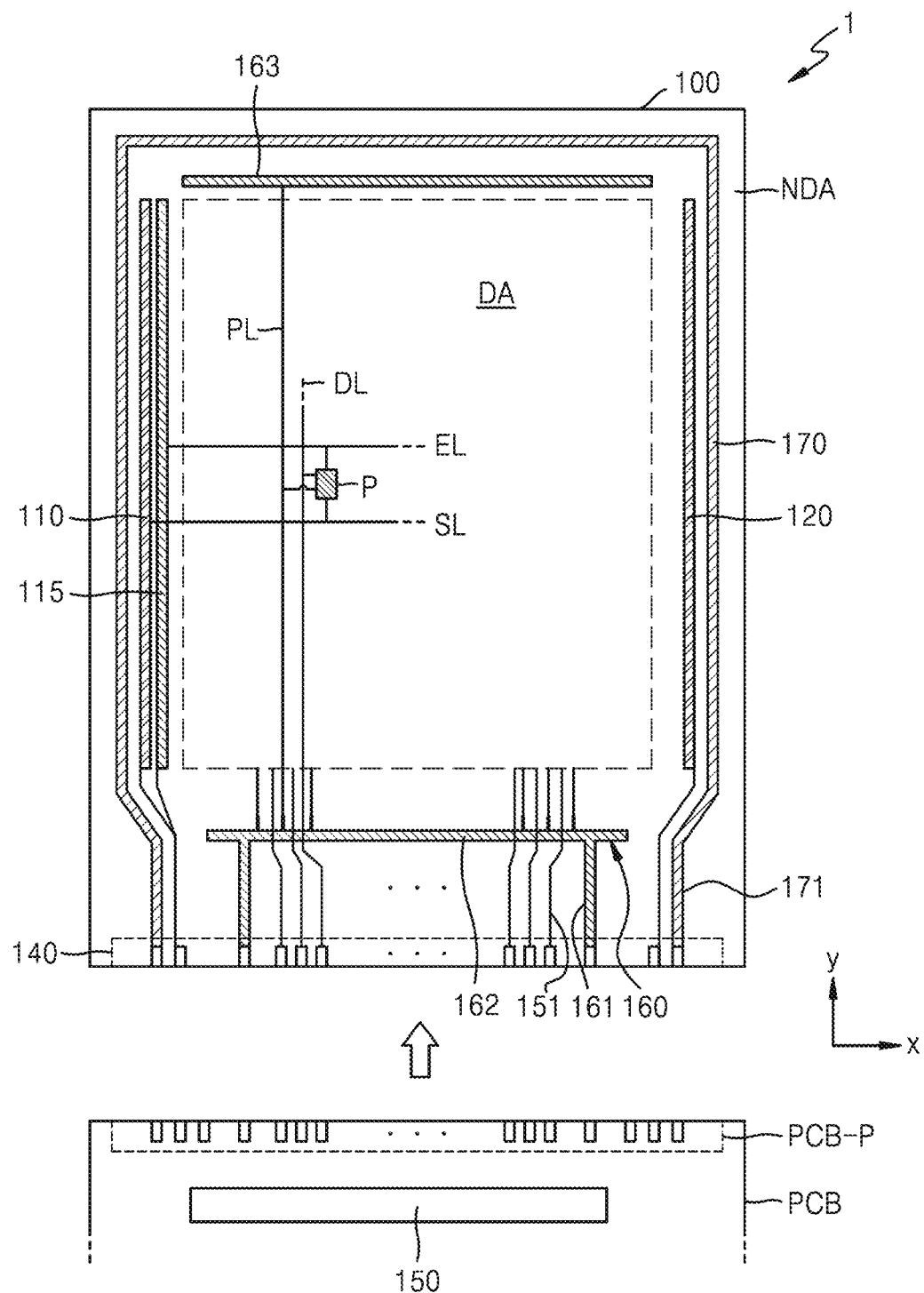
FIG. 2 is a plan view schematically illustrating a display apparatus according to an embodiment.

FIG. 2 is a plan view schematically illustrating a display apparatus according to an embodiment.

Referring to FIG. 2, the display apparatus 1 may include a plurality of pixels P arranged in the display area DA. Each of the pixels P may include a display element such as an organic light emitting diode OLED. Each pixel P may emit, for example, red, green, blue, or white light from the organic light emitting diode OLED. As used herein, the "pixel P" may be understood as a pixel emitting any one of red light, green light, blue light, and white light.

Each pixel P may be connected (e.g., electrically connected) to peripheral circuits arranged in the non-display area NDA. A first scan driving circuit 110, a first emission driving circuit 115, a second scan driving circuit 120, a terminal 140, a data driving circuit 150, a first power supply line 160, and a second power supply line 170 may be arranged in the non-display area NDA.

The first scan driving circuit 110 may provide a scan signal to each pixel P through a scan line SL. The first emission driving circuit 115 may provide an emission control signal to each pixel P through an emission control line EL. The second scan driving circuit 120 may be arranged parallel to the first scan driving circuit 110 with the display area DA therebetween. Some of the pixels P arranged in the display area DA may be connected (e.g., electrically connected) to the first scan driving circuit 110, and the others may be connected (e.g., electrically connected) to the second scan driving circuit 120. In an embodiment, the second scan driving circuit 120 may be omitted.

The first emission driving circuit 115 may be arranged on or in the non-display area NDA while being spaced apart from the first scan driving circuit 110 in the x direction. Also, in an embodiment, the first emission driving circuit 115 may be arranged alternately in the y direction with the first scan driving circuit 110. For example, the first emission driving circuit 115 may be alternately arranged and spaced apart from the first scan driving circuit 110 in the y direction.

The terminal 140 may be arranged at one side of a substrate 100. The terminal 140 may be exposed, by not being covered by an insulating layer, and be connected (e.g., electrically connected) to a printed circuit board PCB. For example, a contact of the terminal 140 may be exposed to connect (e.g., electrically connect) to the printed circuit board PCB (e.g., a terminal PCB-P of the printed circuit board PCB). A terminal PCB-P of the printed circuit board PCB may be connected (e.g., electrically connected) to the terminal 140 of the display apparatus 1. The printed circuit board PCB may be configured to transmit power or signals of a controller to the display apparatus 1. A control signal generated by the controller may be transmitted to each of the first scan driving circuit 110, the first emission driving circuit 115, and the second scan driving circuit 120 through the printed circuit board PCB. The controller may provide a first power voltage ELVDD and a second power voltage ELVSS to the first power supply line 160 and the second power supply line 170 through a first connection line 161 and a second connection line 171, respectively. The first power voltage ELVDD may be provided to each pixel P through a driving voltage line PL connected to the first power supply line 160, and the second power voltage ELVSS may be provided to an opposite electrode of each pixel P connected to the second power supply line 170. For example, the first power voltage ELVDD may be a driving voltage, and the second power voltage ELVSS may be a common voltage.

The data driving circuit 150 may be connected (e.g., electrically connected) to a data line DL. A data signal of the data driving circuit 150 may be provided to each pixel P through a connection line 151 connected to the terminal 140 and a data line DL connected to the connection line 151.

FIG. 2 illustrates that the data driving circuit 150 is arranged on the printed circuit board PCB. However, in an embodiment, the data driving circuit 150 may be arranged on the substrate 100. For example, the data driving circuit 150 may be arranged between the terminal 140 and the first power supply line 160 on the substrate 100.

The first power supply line 160 may include a first subline 162 and a second subline 163 extending in parallel in the x direction with the display area DA therebetween. The second power supply line 170 may partially surround the display area DA in a loop shape with one side open. In an embodiment, the terminal 140 may be at the one open side of the loop shape of the second power supply line 170.

FIGS. 3-8 are cross-sectional views schematically illustrating a method of manufacturing a display apparatus, according to an embodiment.

Hereinafter, a method of manufacturing a display apparatus will be sequentially described with reference to FIGS. 3-8.

A method of manufacturing a display apparatus, according to an embodiment, may include an operation of forming a thin film transistor TFT on a substrate 100 of a display area DA, an operation of forming a planarization layer 113 on the thin film transistor TFT, an operation of forming an electrode layer 180 on the planarization layer 113, and an operation of forming a pixel electrode 210 by etching the electrode layer 180 with an etchant composition.

Figure 3:
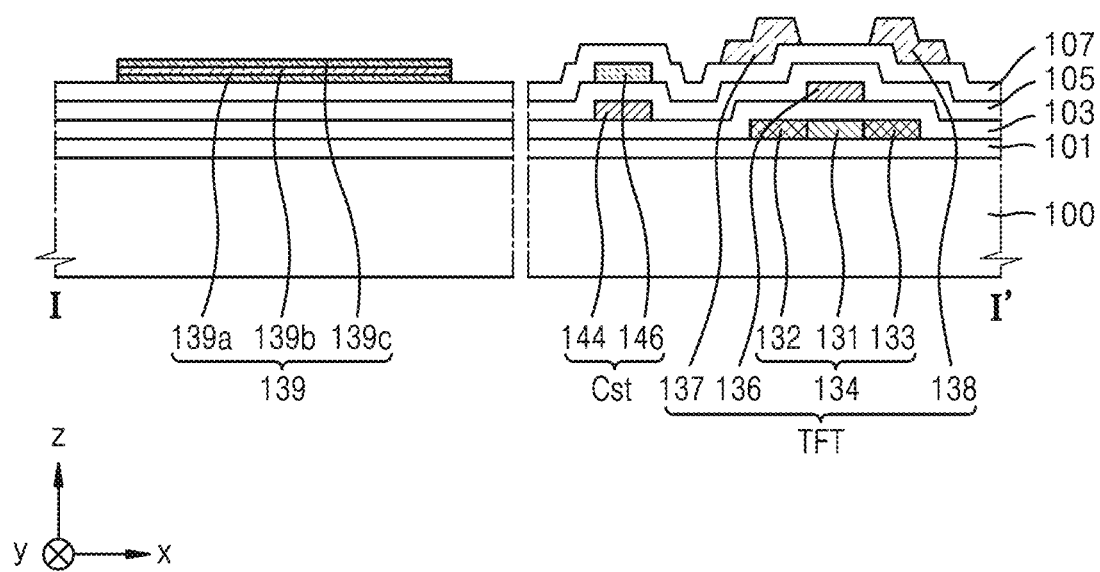
FIGS. 3-8 are cross-sectional views schematically illustrating a method of manufacturing a display apparatus, according to an embodiment.

Referring to FIG. 3, an operation of forming a thin film transistor TFT on the substrate 100 of the display area DA may be performed. The substrate 100 may include a glass material, a ceramic material, a metal material, and/or any flexible or bendable material. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 may have a single-layer or multi-layer structure of the above-mentioned material, and in the case of the multi-layer structure, the substrate may further include an inorganic layer. In an embodiment, the substrate 100 may have an organic/inorganic/organic structure.

A buffer layer 101 may be formed on the substrate 100. The buffer layer 101 may be on the substrate 100 to reduce or block the penetration of foreign materials, moisture, or external air from the bottom of the substrate 100. The buffer layer 101 may provide a flat surface on the substrate 100. The buffer layer 101 may include an inorganic material (e.g., oxide or nitride), an organic material, or an organic/inorganic composite and may include a single-layer or multi-layer structure of an inorganic material and an organic material.

A thin film transistor TFT may be formed on the buffer layer 101. The thin film transistor TFT may include a semiconductor layer 134, a gate electrode 136, a source electrode 137, and a drain electrode 138. The thin film transistor TFT may be connected (e.g., electrically connected) to an organic light emitting diode OLED described in more detail below to drive the organic light emitting diode OLED.

The semiconductor layer 134 may include a channel area 131 formed on the buffer layer 101 and overlapping the gate electrode 136. The semiconductor layer 134 may include a source area 132 and a drain area 133 arranged on respective sides of the channel area 131. The source area 132 and the drain area 133 may each include a higher concentration of impurities than the channel area 131. Here, the impurities may include N-type impurities or P-type impurities. The source area 132 and the drain area 133 may be electrically and respectively connected to the source electrode 137 and the drain electrode 138 described in more detail below. For example, the source area 132 may be connected (e.g., electrically connected) to the source electrode 137, and the drain area 133 may be connected (e.g., electrically connected) to the drain electrode 138. The source area 132 may overlap the source electrode 137 in the z direction, and the drain area 133 may overlap the drain electrode 138 in the z direction.

The semiconductor layer 134 may include an oxide semiconductor and/or a silicon semiconductor. When the semiconductor layer 134 includes an oxide semiconductor, the semiconductor layer 134 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). For example, the semiconductor layer 134 may include InSnZnO (ITZO) or InGaZnO (IGZO). When the semiconductor layer 134 includes a silicon semiconductor, the semiconductor layer 134 may include, for example, amorphous silicon (a-Si) or low temperature poly-silicon (LTPS) crystallized from amorphous silicon (a-Si).

A first insulating layer 103 may be formed on the semiconductor layer 134. The first insulating layer 103 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 103 may include a single-layer or a multi-layer structure including the above-mentioned inorganic insulating material.

The gate electrode 136 may be formed on the first insulating layer 103. The gate electrode 136 may include a single-layer or a multi-layer structure formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The gate electrode 136 may be connected to a gate line such that an electrical signal may be applied to the gate electrode 136.

A second insulating layer 105 may be formed on the gate electrode 136. The second insulating layer 105 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 105 may include a single-layer or a multi-layer structure including the above-mentioned inorganic insulating material.

A storage capacitor Cst may be formed on the first insulating layer 103. The storage capacitor Cst may include a lower electrode 144 and an upper electrode 146 overlapping (e.g., overlapping in the z direction or in a plan view) the lower electrode 144. The lower electrode 144 and the upper electrode 146 of the storage capacitor Cst may overlap each other with the second insulating layer 105 therebetween. In other words, the lower electrode 144 and the upper electrode 146 of the storage capacitor Cst may overlap each other in the z direction (or in the plan view) and the second insulating layer 105 may be between the lower electrode 144 and the upper electrode 146 in the z-direction (or in the plan view).

In an embodiment, the lower electrode 144 of the storage capacitor Cst may overlap the gate electrode 136 of the thin film transistor TFT, and the lower electrode 144 of the storage capacitor Cst may be integrally provided with the gate electrode 136 of the thin film transistor TFT.

The upper electrode 146 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and may include a single-layer or a multi-layer structure of the above-mentioned material.

A third insulating layer 107 may be formed on the upper electrode 146 of the storage capacitor Cst. The third insulating layer 107 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 107 may include a single-layer or a multi-layer structure including the above-mentioned inorganic insulating material.

The source electrode 137 and the drain electrode 138 may be formed on the third insulating layer 107. The source electrode 137 and the drain electrode 138 may include a conductive material including molybdenum (Mo), aluminum (Al), copper (Cu), titanium (Ti), or the like and may include a single-layer or a multi-layer structure including the above-mentioned material. The source electrode 137 and the drain electrode 138 may include a multi-layer structure of Ti/Al/Ti.

When the source electrode 137 and the drain electrode 138 are formed on the third insulating layer 107 of the display area DA, a line layer 139 may be formed on the third insulating layer 107 of the non-display area NDA by the same process. The line layer 139 may include the same material as the source electrode 137 or the drain electrode 138. The line layer 139 may include a first line layer 139a including a second metal, a second line layer 139b including a third metal, and a third line layer 139c including the second metal. The second metal and the third metal may include molybdenum (Mo), aluminum (Al), copper (Cu), titanium (Ti), or the like. For example, the second metal may include titanium (Ti), and the third metal may include aluminum (Al). Thus, the line layer 139 may have a titanium (Ti)/aluminum (AD/titanium (Ti) multi-layer structure.

Lines arranged on the same layer as the semiconductor layer 134, the gate electrode 136, and the upper electrode 146 of the display area DA may be arranged under the line layer 139, but are omitted for convenience of description. The electrode layer 180 described in more detail below may be etched by an etchant composition with the top surface of the line layer 139 exposed.

Figure 4:
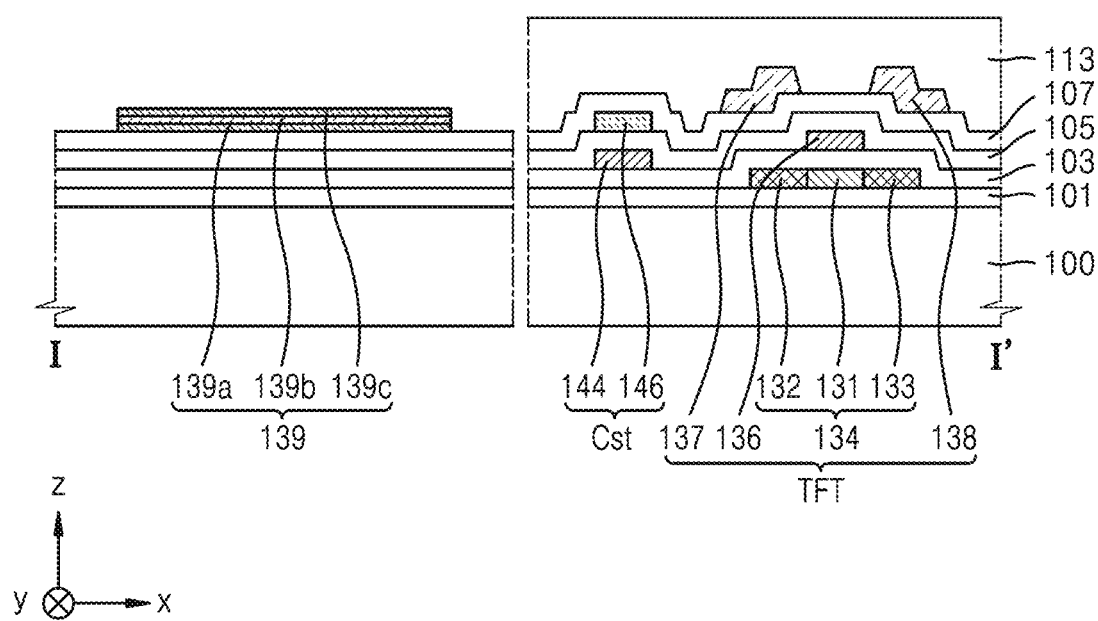

Referring to FIG. 4, after the operation of forming the thin film transistor TFT on the substrate 100 of the display area DA, an operation of forming a planarization layer 113 on the thin film transistor TFT may be further performed.

The planarization layer 113 may be formed on the source electrode 137 and the drain electrode 138. The planarization layer 113 may include a single-layer or a multi-layer structure formed of an organic material or an inorganic material. In an embodiment, the planarization layer 113 may include a general-purpose polymer such as benzocyclobutene (BCB), polyimide (PI), hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. The planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). After the forming of the planarization layer 113, chemical mechanical polishing may be performed to provide a flat upper surface. In an embodiment, a contact metal layer may be formed on the planarization layer 113, and a planarization layer may be additionally formed on the contact metal layer.

Figure 5:
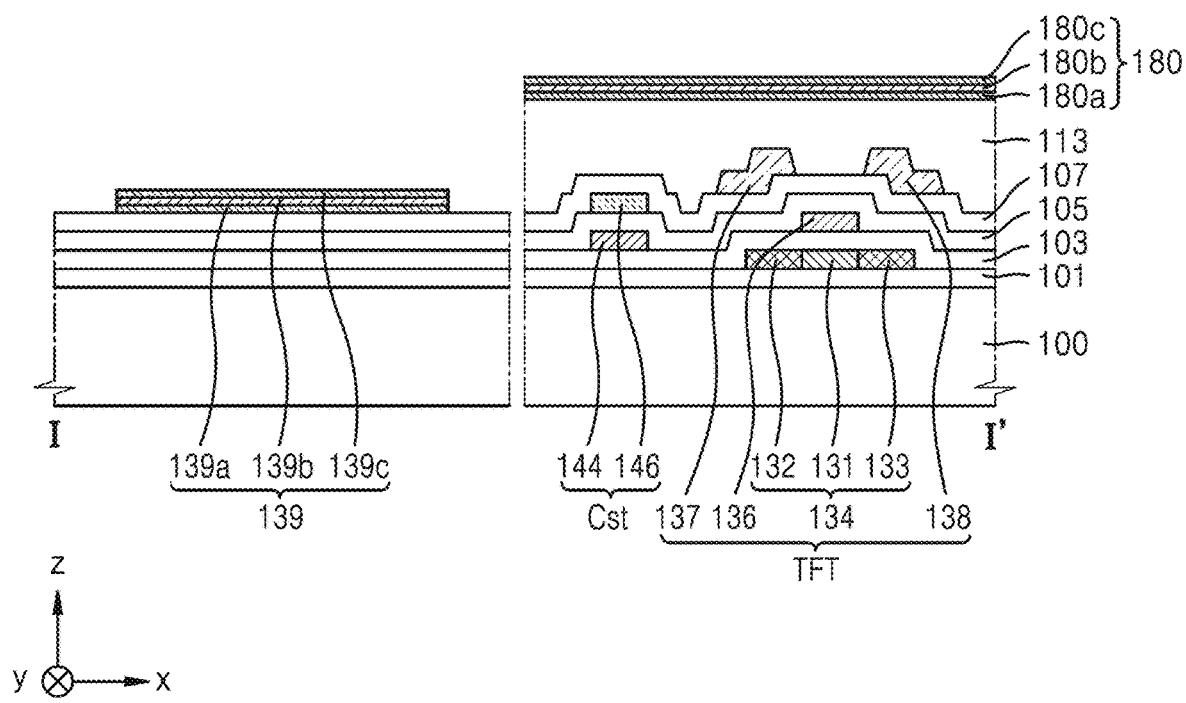

Referring to FIG. 5, after the operation of forming the planarization layer 113 on the thin film transistor TFT, an operation of forming an electrode layer 180 on the planarization layer 113 may be further performed. The electrode layer 180 may include a reflective layer formed of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or any compound thereof and a transparent or semitransparent conductive layer formed on the reflective layer. The transparent or semitransparent electrode may include at least one of indium tin oxide (ITO), indium zinc oxide (IZO), zinc oxide (ZnO), indium oxide ($In_2O_3$), indium gallium oxide (IGO), or aluminum zinc oxide (AZO). In an embodiment, the electrode layer 180 may include a first conductive layer 180a, a second conductive layer 180b including a first metal and arranged on the first conductive layer 180a, and a third conductive layer 180c arranged on the second conductive layer 180b. For example, the first conductive layer 180a and the third conductive layer 180c may include an indium tin oxide (ITO) that is a transparent or semitransparent conductive layer, and the first metal may include silver (Ag). Thus, in this case, the electrode layer 180 may include a stack structure of indium tin oxide (ITO)/silver (Ag)/indium tin oxide (ITO).

Figure 6:
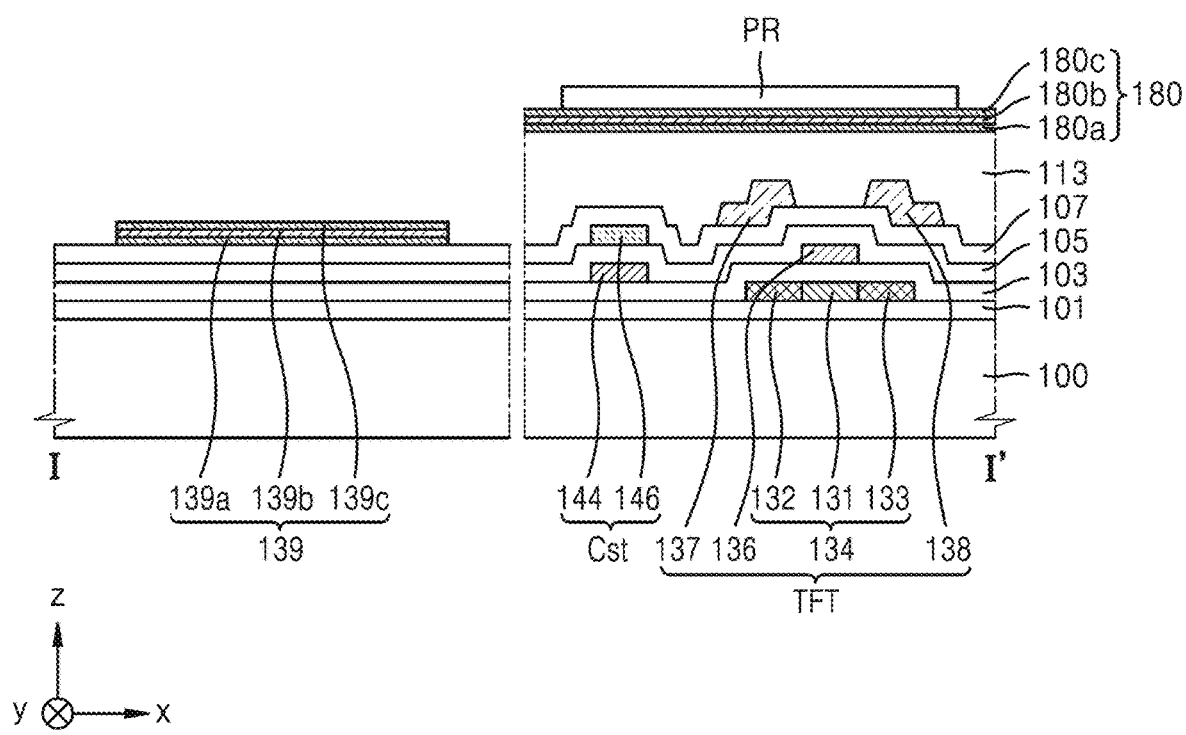
Figure 7:
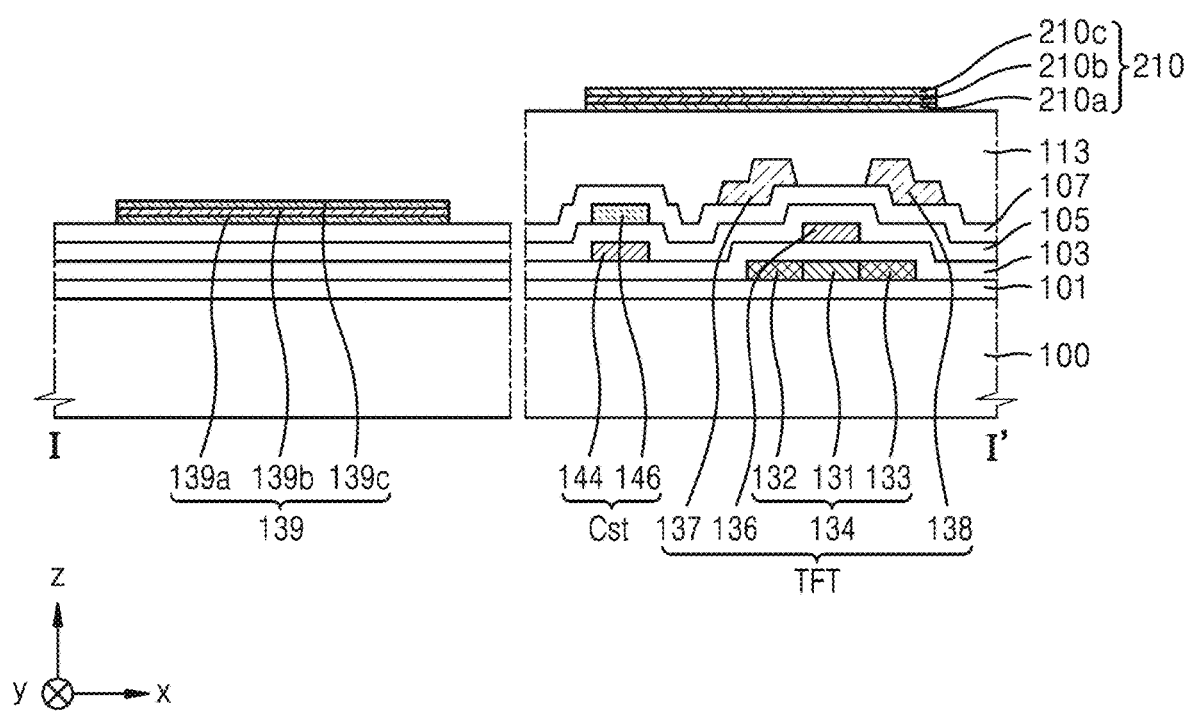

Referring to FIGS. 6 and 7, after the operation of forming the electrode layer 180 on the planarization layer 113, an operation of forming a pixel electrode 210 by etching the electrode layer 180 with an etchant composition may be further performed.

In an embodiment, in the operation of forming the pixel electrode 210 by etching the electrode layer 180 with the etchant composition, a photoresist pattern PR may be patterned on the electrode layer 180 and then the pixel electrode 210 may be formed by etching the electrode layer 180 by using the above-mentioned etchant composition. In other words, the photoresist pattern PR may be patterned on the electrode layer 180 prior to applying the etchant composition to form the pixel electrode 210 by etching the electrode layer 180.

The pixel electrode 210 may include a first layer 210a, a second layer 210b, and a third layer 210c. The first layer 210a, the second layer 210b, and the third layer 210c of the pixel electrode 210 may respectively correspond to the first conductive layer 180a, the second conductive layer 180b, and the third conductive layer 180c of the electrode layer 180. For example, the first layer 210a, the second layer 210b, and the third layer 210c may be formed by etching the first conductive layer 180a, the second conductive layer 180b, and the third conductive layer 180c respectively. In an embodiment, the first layer 210a and the third layer 210c of the pixel electrode 210 may include indium tin oxide (ITO), and the second layer 210b may include silver (Ag). In this case, the pixel electrode 210 may include a stack structure of indium tin oxide (ITO)/silver (Ag)/indium tin oxide (ITO).

Accordingly, the pixel electrode 210 may be formed by etching the electrode layer 180 including, in an embodiment, a multi-layer structure such as indium tin oxide (ITO)/silver (Ag)/indium tin oxide (ITO) by using an etchant composition according to an embodiment.

Various lines and electrodes included in the display apparatus may include silver (Ag). However, because a line or electrode including silver (Ag) has a weak bonding strength with a layer or film located over or under (e.g., directly on) the line or electrode include silver (Ag), the line or electrode may include a multi-layer structure including a stack of a layer including silver (Ag) and other conductive layers. For example, the stack may include silver (Ag) between other conductive layers.

Also, various lines and electrodes included in the display apparatus may be formed by using a patterning process such as photolithography including an etching process, and when the lines or electrodes include multiple layers having different properties, there may be a limit in forming lines or electrodes having desired or suitable characteristics by a concurrent (e.g., simultaneous) etching process. In addition, because an etchant of the related art used to etch a line may include phosphoric acid, other lines in a display apparatus may be damaged by the phosphoric acid during the etching process and silver ions may be reduced and precipitated through this process, and accordingly, defects may occur (or be introduced) due to silver particles. In order to prevent or reduce the occurrence of silver particles, a multi-layer structure including silver (Ag) and other conductive layers may be sequentially etched. However, the above-mentioned method (e.g., method including sequential etching) may reduce (e.g., significantly reduce) the efficiency of the manufacturing process. For example, additional processing steps or tasks may be needed which may decrease efficiency (e.g., throughput) of the manufacturing process.

The etchant composition according to an embodiment may prevent or substantially prevent silver (Ag) ions from being reduced and precipitated while collectively etching an electrode layer including a multi-layer structure such as indium tin oxide (ITO)/silver (Ag)/indium tin oxide (ITO). Accordingly, the reliability of the display apparatus may be improved. Further, efficiency (e.g., throughput) may be improved compared to sequential etching.

The etchant composition according to an embodiment may include an inorganic acid compound of about 8 wt % to about 15 wt %, a sulfonic acid compound of about 2.5 wt % to about 8 wt %, a sulfate compound of about 6 wt % to about 14 wt %, an organic acid compound of about 40 wt % to about 55 wt %, a metal or metal salt of about 0.01 wt % to about 0.06 wt %, and a remaining amount of water.

The inorganic acid compound may include a nitric acid. The nitric acid may be a component used as an oxidizer and may be used to etch silver (Ag) and other conductive layers. For example, the nitric acid may be used to oxidize and wet-etch silver (Ag) and other conductive layers. The content of the nitric acid may be about 8 wt % to about 15 wt % in the total weight of the etchant composition. When the content of the nitric acid exceeds about 15 wt %, the etch rate of the other conductive layers (e.g., a transparent or semitransparent conductive layer) may be accelerated and thus an undercut may occur in the other conductive layers located over and/or under silver (Ag), which may cause a problem in a subsequent process. When the content of the nitric acid is less than about 8 wt %, the etch rate of the silver (Ag) and the other conductive layers may be reduced and thus the etching uniformity may be reduced depending on the position of the substrate, which may cause a stain. Thus, when the nitric acid of about 8 wt % to about 15 wt % is included in the etchant composition, the etch rate may be easily controlled (e.g., more easily controlled) and the silver (Ag) and the other conductive layers may be uniformly or substantially uniformly etched.

The sulfonic acid compound may include at least one of a methanesulfonic acid, an ethanesulfonic acid, or a propanesulfonic acid.

The sulfonic acid compound may be used as an etchant for etching the silver (Ag) and conductive layers oxidized with the nitric acid. The sulfonic acid compound may maintain a constant or substantially constant etch rate by reducing the decomposition rate of the nitric acid. The content of the sulfonic acid compound may be about 2.5 wt % to about 8 wt % in the total weight of the etchant composition. When the content of the sulfonic acid compound is high, because the etch rate of the silver (Ag) may become too high, a tip may occur in the conductive layers located over and/or under the silver (Ag) or a line defect may occur due to the over-etching of silver (Ag). When the content of the sulfonic acid compound is low, the effect of inhibiting the decomposition of the nitric acid may be reduced and thus the stability may be reduced and a silver (Ag) residue may occur. Thus, when the sulfonic acid compound of about 2.5 wt % to about 8 wt % is included in the etchant composition, the etch rate of the silver (Ag) and conductive layers may be easily controlled and a defect due to the occurrence of a silver (Ag) residue and silver (Ag) resorption may be prevented or substantially prevented.

The sulfate compound may include at least one of a potassium hydrogen sulfate, a sodium hydrogen sulfate, or an ammonium hydrogen sulfate.

The sulfate compound may be used as an etchant for etching the conductive layer. The sulfate compound may cause an etch stop of silver (Ag). In this case, the etch stop may mean that a skew, which is the distance between the photoresist pattern end and the silver (Ag) end, may not increase even when time elapses (e.g., additional time elapses where the silver (Ag) is exposed to the etchant composition including the sulfate compound). Thus, even when the etching time increases in the etching process, an increase of the side etch of silver (Ag) may be prevented or substantially prevented. That is, because the etchant composition according to an embodiment includes a sulfate compound, the etch stop characteristics may be implemented and the etch rate may be controlled and accordingly the side etch may be controlled.

The content of the sulfate compound may be about 6 wt % to about 14 wt % in the total weight of the etchant composition. When the content of the sulfate compound is higher than about 14 wt %, the etch rate of the conductive layer may be too high and thus a corrosion failure may be induced. When the content of the sulfate compound is lower than about 6 wt %, the etch rate of the conductive layer may decrease and thus a residue of silver (Ag) and the other conductive layers may occur. Thus, when the sulfate compound of about 6 wt % to about 14 wt % is included in the etchant composition, the etch rate may be easily controlled and the etch stop characteristics may be implemented and thus the silver (Ag) and the other conductive layers may be uniformly etched.

The organic acid compound may include at least one of an acetic acid, a citric acid, a glycolic acid, a malonic acid, a lactic acid, or a tartaric acid. For example, the organic acid compound may include an acetic acid and a citric acid.

The organic acid compound may be used as an etchant for etching the silver (Ag). The organic acid compound may be used to etch the silver (Ag) oxidized by the nitric acid described above.

The content of the organic acid compound may be about 40 wt % to about 55 wt % in the total weight of the etchant composition. When the content of the organic acid compound is less than about 40 wt %, a stain may occur due to a non-uniform etch rate depending on the position of the substrate. When the content of the organic acid compound is more than about 55 wt %, an over-etching problem may occur. Thus, when the organic acid compound of about 40 wt % to about 55 wt % is included in the etchant composition, the etch rate of silver (Ag) may be controlled (e.g., easily controlled) and a defect due to the occurrence of a silver (Ag) residue and resorption may be prevented or be substantially prevent.

The metals or metal salt may include a metal such as iron (Fe) or copper (Cu) or a metal salt such as iron (Fe), copper (Cu), aluminum (Al), molybdenum (Mo), chromium (Cr), or manganese (Mn). For example, the metal or metal salt may include at least one of a ferric nitrate, a ferric sulfate, copper, a copper sulfate, or iron.

The metal or metal salt may be used as an oxidizer of silver (Ag). The metal or metal salt may be used as an auxiliary oxidizer of the nitric acid described above.

The content of the metal or metal salt may be about 0.01 wt % to about 0.06 wt % in the etchant composition. When the content of the metal or metal salt is less than about 0.01%, the etching uniformity may be reduced. When the content of the metal or metal salt is more than about 0.06 wt %, the etch stop characteristics may be degraded. Thus, when the metal or metal salt of about 0.01 wt % to about 0.06 wt % is included in the etchant composition, the etch rate of silver (Ag) may be easily controlled, a defect due to a silver (Ag) residue and silver (Ag) resorption may be prevented or be substantially prevented, and the etch stop characteristics may be improved.

The etchant composition according to an embodiment may include water. The water may be included in the etchant composition such that the sum of the wt % of components other than the water and the wt % of the water may be 100 wt %. Ultrapure water may be used as the water included in the etchant composition. The water included in the etchant composition may function to activate the sulfate compound.

In an embodiment, the content of the water may be about 28 wt % to about 30 wt % in the etchant composition. When the content of the water is less than about 28 wt %, the etch stop characteristics may be degraded. When the content of the water is more than about 30 wt %, there may be a problem such as the occurrence of a silver residue. Thus, when the water of about 28 wt % to about 30 wt % is included in the etchant composition, a defect due to a silver residue may be prevented or be substantially prevented and the etch stop characteristics may be implemented.

In an embodiment, the wt % ratio of the sulfate compound to the organic acid compound may be about 1:4 to about 1:5. When the wt % ratio of the sulfate compound to the organic acid compound satisfies about 1:4 to about 1:5, the etch stop characteristics may be maintained even when the number of treatments is accumulated as well as at initial etching, and thus the side etch may be controlled.

When the content of the metal or metal salt is maintained at about 600 ppm or less, and the water of about 28 wt % to about 30 wt % is included in the total weight of the etchant composition, the side etch may be more effectively controlled.

Hereinafter, an etchant composition according to an embodiment will be described with reference to Tables 1 and 2.

EXPERIMENTAL EXAMPLE 1

The etchant compositions according to Embodiments 1 to 4 (Embodiment 1, Embodiment 2, Embodiment 3, and Embodiment 4) and Comparative Examples 1 to 7 (Comparative Example 1, Comparative Example 2, Comparative Example 3, Comparative Example 4, Comparative Example 5, Comparative Example 6, and Comparative Example 7) were manufactured as illustrated in Table 1 below. The % in Table 1 below may be wt %.

TABLE 1

| | Inorganic acid compound Metal or metal salt | Sulfonic acid compound Methane-sulfonic acid (%) | Organic acid compound | | Sulfate compound | | Metal or metal salt | | | | Ratio of sulfate compound to organic acid compound |
|---|---|---|---|---|---|---|---|---|---|---|---|
| | | | Acetic acid (%) | Citric acid (%) | Sodium hydrogen sulfate (%) | Ammonium hydrogen sulfate (%) | Copper (%) | Ferric nitrate (%) | Ferric sulfate (%) | Water (%) | |
| Embodiment 1 | 9.5 | 4.8 | 15 | 31 | 10 | | 0.04 | | | 29.68 | 1:4.6 |
| Embodiment 2 | 9.5 | 4.2 | 15 | 31 | | 10.5 | | 0.03 | | 29.77 | 1:4.3 |
| Embodiment 3 | 9.5 | 5 | 16 | 31 | 10 | | | | 0.05 | 28.45 | 1:4.7 |
| Embodiment 4 | 9 | 5 | 15 | 32 | | 9.5 | | 0.02 | | 29.48 | 1:4.9 |
| Comparative Example 1 | 9.5 | 4.5 | 15 | 28 | 11 | | 0.03 | | | 31.97 | 1:3.9 |
| Comparative Example 2 | 9.8 | 4.5 | 20 | 32 | | 10 | | 0.02 | | 23.68 | 1:5.2 |
| Comparative Example 3 | 10 | 5 | 10 | 12.5 | | 5 | | | 0.04 | 57.46 | 1:4.5 |
| Comparative Example 4 | 9 | 4 | 30 | 30 | 14 | | 0.02 | | | 12.98 | 1:4.2 |

TABLE 1-continued

| | Inorganic acid compound Metal or metal salt | Sulfonic acid compound Methane-sulfonic acid (%) | Organic acid compound | | Sulfate compound | | Metal or metal salt | | | | Ratio of sulfate compound to organic acid compound |
|---|---|---|---|---|---|---|---|---|---|---|---|
| | | | Acetic acid (%) | Citric acid (%) | Sodium hydrogen sulfate (%) | Ammonium hydrogen sulfate (%) | Copper (%) | Ferric nitrate (%) | Ferric sulfate (%) | Water (%) | |
| Comparative Example 5 | 9.5 | 4.5 | 15 | 30 | 10 | | | | | 31 | 1:4.5 |
| Comparative Example 6 | 9.5 | 4.5 | 15 | 30 | 10 | | | 0.1 | | 30.9 | |
| Comparative Example 7 | 9.5 | 5.5 | 17 | 31 | | 10 | | 0.02 | | 28.95 | 1:4.8 |

Comparative Example 1 and Comparative Example 2 may respectively correspond to the cases where the ratio of the sulfate compound to the organic acid compound is about 1:3.9 and about 1:5.2 deviating from a weight ratio of about 1:4 to about 1:5, Comparative Example 3 may correspond to the case where the content of the organic acid compound is less than about 40 wt % and the content of the sulfate compound is less than about 6 wt %, and Comparative Example 4 may correspond to the case where the content of the organic acid compound is more than about 55 wt %. Also, Comparative Example 5 may correspond to the case where no metal or metal salt is added, Comparative Example 6 may correspond to the case where the content of the metal or metal salt is more than about 0.06 wt %, and Comparative Example 7 may correspond to the case where the content of the water is less than about 28 wt %.

After forming a multi-layer structure (e.g., triple layer) of indium tin oxide (ITO)/silver (Ag)/indium tin oxide (ITO) on a substrate and producing a specimen by patterning a photoresist on the triple layer, an etching process was performed by using a first etchant and a second etchant. In this case, the first etchant may correspond to the etchant composition of Embodiments 1 to 4 and Comparative Examples 1 to 7, and the second etchant may correspond to the etchant obtained by dissolving silver powders in the etchant composition of Embodiments 1 to 4 and Comparative Examples 1 to 7, assuming that an etching process was performed for a long time.

1) Side Etch and Etch Stop Measurement and Evaluation Criterion

After the first etchant and the second etchant were inserted into the spray-etching test equipment (Model name: ETCHER(TFT), SEMES) and the temperature was set to 40° C. causing a rise in temperature, an etching process was performed on the specimen when the temperature reached 40° C.±0.1° C. The specimen was additionally over-etched by 50% and 100% from the time when the etching of the specimen was ended (e.g., the etching time was increased by 50% and 100%), and the side etch resulting from each of 50% over-etching and 100% over-etching was measured by using an electron scanning microscope (Model name: SU-8010, HITACHI). In this case, the side etch may correspond to the distance from the end of the patterned photoresist to the etched silver (Ag).

A suitable range of the side etch may be less than about 0.3 μm. When the side etch exceeds about 0.3 μm, it may be considered or categorized as a defect. Also, the etch stop may be determined as good when the side etch change of 100% over-etching compared to 50% over-etching is less than about 0.05 μm. The etch stop may be considered as poor when the side etch change of 100% over-etching compared to 50% over-etching exceeds about 0.05 μm.

2) Silver (Ag), Indium Tin Oxide (ITO) Residue Measurement, and Evaluation Criterion After the first etchant and the second etchant were inserted into the spray-etching test equipment (Model name: ETCHER(TFT), SEMES) and the temperature was set to 40° C. causing a rise in temperature, an etching process was performed on the specimen when the temperature reached 40° C.±0.1° C. The total etching time was 85 seconds. When the 85-second etching time elapsed after the specimen was inserted and spraying was started, the specimen was extracted and cleaned with deionized water and then dried by using a hot air dryer. The photoresist was then removed by using a photoresist (PR) stripper. After the cleaning and drying, the electron scanning microscope (Model name: SU-8010, HITACHI) was used to measure a residue that is a phenomenon in which silver (Ag) and indium tin oxide (ITO) remain unetched in a region not covered by the photoresist (e.g., not covered by the photoresist during the etching process and prior to the photoresist being stripped by the photoresist stripper). When no residue was measured, it was evaluated as good, and when a residue was measured, it was evaluated as poor.

3) Silver (Ag) Resorption Measurement and Evaluation Criterion

After the first etchant and the second etchant were inserted into the spray-etching test equipment (Model name: ETCHER(TFT), SEMES) and the temperature was set to 40° C. causing a rise in temperature, an etching process was performed on the specimen when the temperature reached 40° C.±0.1° C. The total etching time was 85 seconds. When the 85-second etching time elapsed after the specimen was inserted and spraying was started, the specimen was extracted and cleaned with deionized water and then dried by using a hot air dryer. After the cleaning and drying, the electron scanning microscope (Model name: SU-8010, HITACHI) (Ag) was used to measure the number of silver (Ag) particles adsorbed onto the upper titanium (Ti) of the titanium (Ti)/aluminum (Al)/titanium (Ti) triple layer exposed in the specimen. In this case, when the measured number of silver (Ag) particles was about 10 or less, it was evaluated as good, and when the measured number of silver (Ag) particles was more than about 10, it was evaluated as poor.

TABLE 2

| | First etchant | | | | | Second etchant | | | | |
|---|---|---|---|---|---|---|---|---|---|---|
| | Side etch (μm) | | Etch stop | Silver (Aq)/ITO residue | Silver (Ag) resorption | Side etch (μm) | | Etch stop | Silver (Aq)/ITO residue | Silver (Ag) resorption |
| | O/E 50% | O/E 100% | | | | O/E 50% | O/E 100% | | | |
| Embodiment 1 | 0.15 | 0.15 | ○ | ○ | ○ | 0.20 | 0.19 | ○ | ○ | ○ |
| Embodiment 2 | 0.16 | 0.16 | ○ | ○ | ○ | 0.21 | 0.22 | ○ | ○ | ○ |
| Embodiment 3 | 0.17 | 0.17 | ○ | ○ | ○ | 0.20 | 0.21 | ○ | ○ | ○ |
| Embodiment 4 | 0.17 | 0.18 | ○ | ○ | ○ | 0.22 | 0.22 | ○ | ○ | ○ |
| Comparative Example 1 | 0.15 | 0.25 | X | X | ○ | 0.21 | 0.32 | X | X | X |
| Comparative Example 2 | 0.32 | 0.45 | X | ○ | ○ | 0.37 | 0.48 | X | ○ | ○ |
| Comparative Example 3 | Partial unetch | 0.01 | X | X | X | Partial unetch | 0.01 | X | X | X |
| Comparative Example 4 | Insoluble solid material | | | | | | | | | |
| Comparative Example 5 | 0.10 | 0.10 | ○ | X | ○ | 0.20 | 0.20 | ○ | X | X |
| Comparative Example 6 | 0.70 | 0.86 | X | ○ | ○ | 0.37 | 0.99 | X | ○ | ○ |
| Comparative Example 7 | 0.10 | 0.29 | X | ○ | ○ | 0.24 | 0.50 | X | ○ | ○ |

In Table 2, O denotes good and X denotes poor. Referring to Table 2, when the ratio of the sulfate compound to the organic acid compound in the etchant composition was about 1:4 to about 1:5 as in Embodiments 1 to 4, the side etch of the etchants (the first etchant and the second etchant), the silver (Ag) and indium tin oxide (ITO) residues, and the silver (Ag) resorption characteristics satisfied the evaluation criterion. When the ratio of the sulfate compound to the organic acid compound in the etchant composition deviated from about 1:4 to about 1:5 as in Comparative Examples 1 and 2, the etching performance was degraded and thus silver (Ag) and indium tin oxide (ITO) residues and a silver (Ag) resorption failure occurred in the first etchant and the second etchant, or the etch rate could not be controlled and thus the side etch or etch stop characteristics were also poor in the first etchant.

As in Comparative Example 3, when the content ratio of the sulfate compound to the organic acid compound is satisfied but the content of the sulfate compound and the organic acid compound included in the etchant composition is small, the side etch, etch stop, silver (Ag) and indium tin oxide (ITO) residue, and silver (Ag) resorption characteristics were not satisfied.

Also, as in Comparative Example 4, when the content ratio of the sulfate compound to the organic acid compound is satisfied but the content of the organic acid compound included in the etchant composition is high and the content of the water is low, there was a problem in that the solid material was not dissolved.

As in Comparative Example 5, when the metal or metal salt is not included in the etchant composition, silver (Ag) and indium tin oxide (ITO) residues or a silver (Ag) resorption failure may occur in the first etchant or the second etchant.

As in Comparative Example 6, when the content of the metal or metal salt included in the etchant composition exceeds about 0.06 wt %, the side etch and etch stop failure may occur.

Also, as in Comparative Example 7, when the content of other materials is satisfied but the content of the water is less than about 28 wt %, the result of being rather poor in terms of the etch stop may be induced.

Figure 9A:
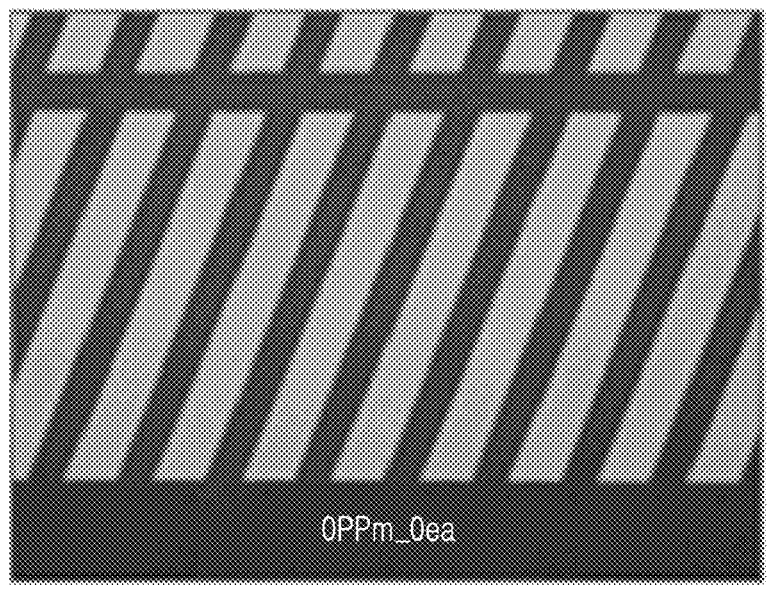
FIG. 9A is a diagram illustrating a state in which a metal pattern is formed by using an etchant composition according to an embodiment.
Figure 9B:
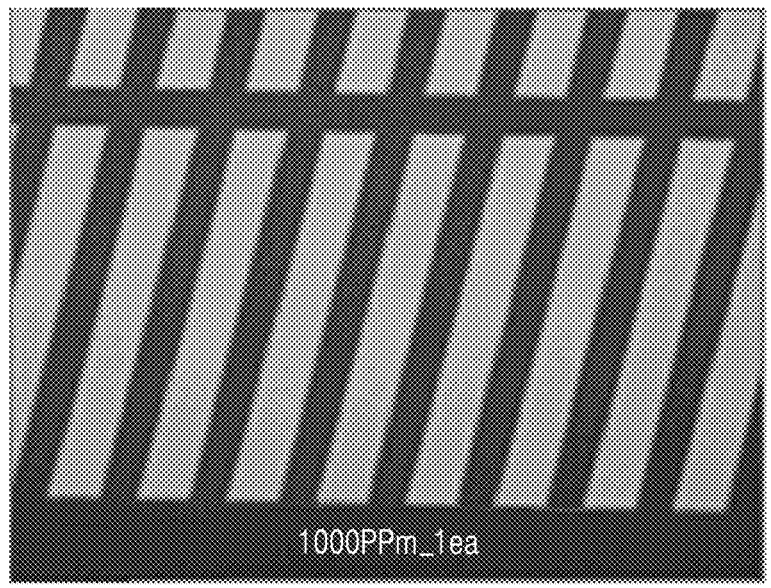
FIG. 9B is a diagram illustrating a state in which a metal pattern is formed after adding 1000 ppm of silver (Ag) to an etchant composition according to an embodiment.

FIG. 9A is a diagram illustrating a state in which a metal pattern is formed by using an etchant composition according to an embodiment, and FIG. 9B is a diagram illustrating a state in which a metal pattern is formed after adding 1000 ppm of silver (Ag) to an etchant composition according to an embodiment. FIG. 9B is a diagram illustrating a state in which a metal pattern is formed after adding 1000 ppm of silver (Ag) to an etchant composition, in order to check the etching characteristics depending on the number of treatments of an etchant composition according to an embodiment.

Referring to FIG. 9A, when a metal pattern is formed by etching a thin film including a multi-layer structure of indium tin oxide (ITO)/silver (Ag)/indium tin oxide (ITO) by using an etchant composition according to an embodiment, it may be seen that silver (Ag) particles are effectively not or hardly precipitated.

Also, referring to FIG. 9B, it may be seen that silver (Ag) particles are effectively not or hardly precipitated even when the number of treatments of the etchant composition according to an embodiment is increased.

Figure 10:
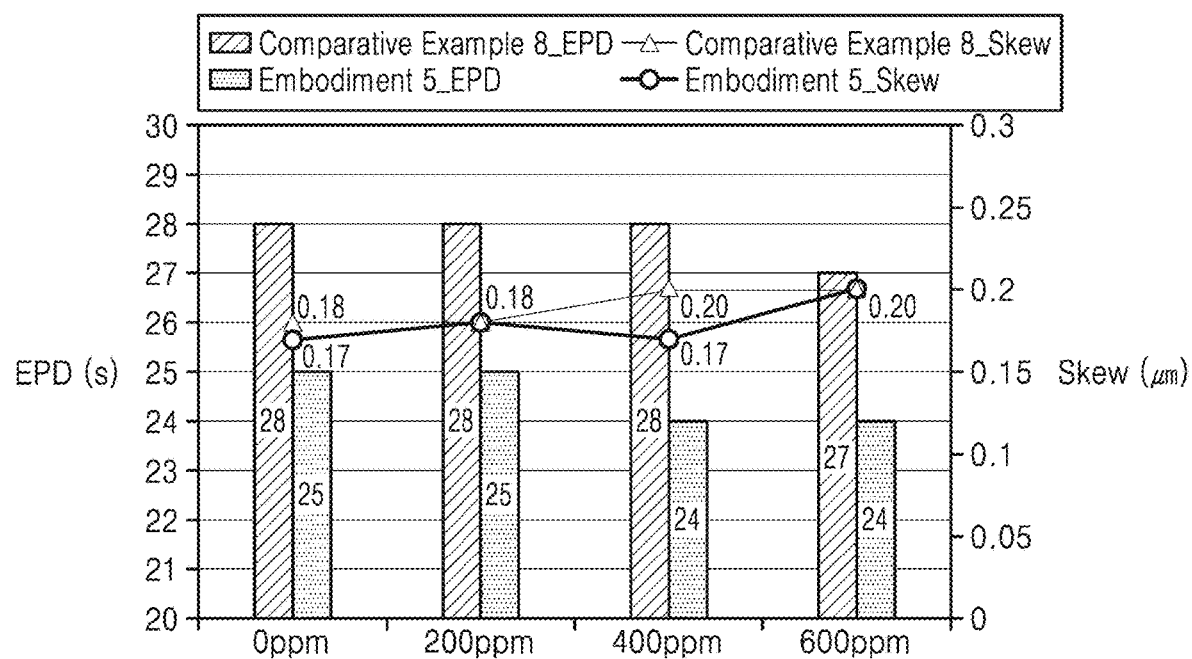
FIG. 10 is a graph illustrating end point detection (EPD) and skew depending on the number of treatments of an etchant composition according to an embodiment and an etchant composition according to a comparative example.

FIG. 10 is a graph illustrating end point detection (EPD) and skew depending on the number of treatments of an etchant composition according to an embodiment and an etchant composition according to a comparative example. More particularly, FIG. 10 is a graph illustrating EPD and skew depending on the number of treatments of an etchant composition according to an embodiment (Embodiment 5) and an etchant composition of the related art (Comparative Example 8). The etchant composition of the related art (Comparative Example 8) may be an etchant composition including a phosphoric acid-based composition, and the etchant composition according to an embodiment (Embodiment 5) may be an etchant composition including an inorganic acid compound of about 8 wt % to about 15 wt %, a sulfonic acid compound of about 2.5 wt % to about 8 wt %, a sulfate compound of about 6 wt % to about 14 wt %, an organic acid compound of about 40 wt % to about 55 wt %, a metal or metal salt of about 0.01 wt % to about 0.06 wt %, and a remaining amount of water. In this case, in order to measure the EPD and the skew depending on the number of treatments, silver (Ag) of 0 ppm, silver (Ag) of 200 ppm, silver (Ag) of 400 ppm, and silver (Ag) of 600 ppm was added to each of the etchant composition of the related art (Comparative Example 8) and the etchant composition according to an embodiment (Embodiment 5).

Referring to FIG. 10, in the case of the etchant composition of the related art (Comparative Example 8), even when the added silver (Ag) increases from 0 ppm to 600 ppm, it may be seen that the EPD satisfies a range of about 27 to about 28 and the skew satisfies about 0.18 to about 0.20. However, in the case of the etchant composition of the related art (Comparative Example 8), when the number of treatments increases, the actual number of treatments of the etchant composition of the related art (Comparative Example 8) may be at most only about 300 due to the defect caused by silver (Ag) particles.

In the case of the etchant composition according to an embodiment (Embodiment 5), even when the added silver (Ag) increases from 0 ppm to 600 ppm, it may be seen that the EPD satisfies a range of about 24 to about 25 and the skew satisfies about 0.17 to about 0.20. That is, it may be seen that the physical properties desired for the etchant composition are maintained constant even when the concentration of silver (Ag) ions is increased as the etchant composition according to an embodiment (Embodiment 5) is used multiple times. In the case of the etchant composition according to an embodiment (Embodiment 5), even when the number of treatments increases, because a defect caused by silver (Ag) particles does not occur, the number of treatments may be improved by about 3 times compared to the etchant composition of the related art.

Also, because the etchant composition according to an embodiment (Embodiment 5) has a smaller EPD than the etchant composition of the related art (Comparative Example 8), when the etchant composition according to an embodiment (Embodiment 5) is used, the time required for the etching process may be reduced to improve the efficiency (e.g., throughput) of the manufacturing process of the display apparatus.

However, when the etchant composition according to an embodiment is used to etch a multi-layer structure (e.g., a triple layer) of indium tin oxide (ITO)/silver (Ag)/indium tin oxide (ITO), a mouse bite may occur in a portion of the upper indium tin oxide (ITO) due to non-uniform formation of the upper indium tin oxide (ITO) and impurities such as dust and the silver (Ag) may be partially etched because the etchant composition permeates through a pin hole formed by the mouse bite.

Thus, according to an embodiment of the present disclosure, an etchant composition may be used to etch a multi-layer structure (e.g., a triple layer) of indium tin oxide (ITO)/silver (Ag)/indium tin oxide (ITO), wherein the upper indium tin oxide (ITO) may be etched by a separate etchant and then the silver (Ag)/indium tin oxide (ITO) may be etched by the etchant composition according to an embodiment, thereby preventing or substantially prevent a mouse bite from occurring.

In the related art, an etching process was performed by using an etchant composition including a first organic acid compound of about 18 wt % to about 25 wt %, a second organic acid compound of about 15 wt % to about 20 wt %, an inorganic acid compound of about 8.1 wt % to about 9.9 wt %, a sulfonic acid compound of about 1 wt % to about 4.9 wt %, a hydrogen sulfate compound of about 10 wt % to about 20 wt %, a nitrogen-containing dicarbonyl compound of about 1 wt % to about 5 wt %, an amino acid derivative compound of about 1 wt % to about 5 wt %, an iron-containing oxidizer compound of about 0.1 wt % to about 2 wt %, and a remaining amount of water. The etchant composition of the related art may include an iron-containing oxidizer compound of about 0.1 wt % to about 2 wt % to prevent or substantially prevent the occurrence of a silver (Ag) residue. However, there was a case in which an etch stop failure occurred due to the iron-containing oxidizer compound included in the etchant composition of the related art. For this purpose, the etchant composition of the related art may include a nitrogen-containing dicarbonyl compound and an amino acid derivative compound.

The nitrogen-containing dicarbonyl compound and the amino acid derivative compound included in the etchant composition of the related art may function as a corrosion inhibitor. The nitrogen-containing dicarbonyl compound and the amino acid derivative compound included in the etchant composition of the related art may form a complex compound with a metal to function as an etching controller for silver (Ag), indium tin oxide (ITO), and aluminum (Al). However, because the etch rate may be reduced due to the dicarbonyl compound and the amino acid derivative compound included in the etchant composition of the related art, a silver (Ag) residue may occur.

The etchant composition according to an embodiment may implement an etch stop by controlling the content of the sulfate compound and the water even without including the nitrogen-containing dicarbonyl compound and the amino acid derivative compound, thereby making it possible to prevent or reduce excessive etching to implement a low skew and provide a high-resolution display apparatus.

Figure 8:
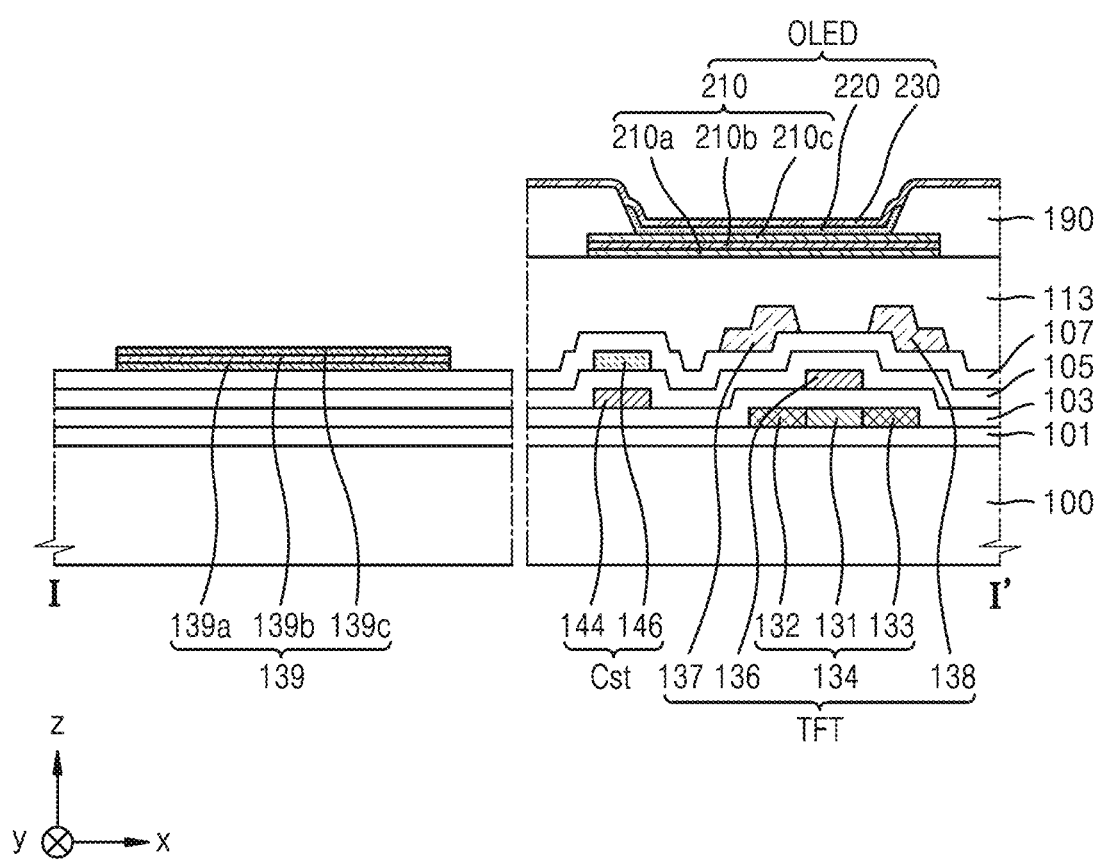

Referring to FIG. 8, after the operation of forming the pixel electrode 210 by etching the electrode layer 180 with the etchant composition, an operation of forming an intermediate layer 220 on the pixel electrode 210 and an opposite electrode 230 on the intermediate layer 220 may be further performed. The pixel electrode 210, the intermediate layer 220, and the opposite electrode 230 may form an organic light emitting diode OLED.

A pixel definition layer 190 may be formed on the planarization layer 113, and the pixel definition layer 190 may have an opening for exposing at least a portion of the pixel electrode 210. The area exposed by the opening of the pixel definition layer 190 may be defined as an emission area. The periphery of emission areas may be a non-emission area, and the non-emission area may surround the emission areas. That is, the display area DA may include a plurality of emission areas and a non-emission area surrounding the emission areas. The pixel definition layer 190 may increase the distance between the pixel electrode 210 and the opposite electrode 230 over the pixel electrode 210 to prevent or substantially prevent an arc or the like from occurring at the edge of the pixel electrode 210. For example, the pixel definition layer 190 may be formed of an organic insulating material such as polyimide, polyamide, acrylic resin, benzocyclobutene, hexamethyldisiloxane (HMDSO), or phenol resin by spin coating or the like.

The intermediate layer 220 may be arranged on the pixel electrode 210 at least partially exposed by the pixel definition layer 190. The intermediate layer 220 may include an emission layer, and a first functional layer and a second functional layer may be selectively arranged under and over the emission layer.

In an embodiment, the intermediate layer 220 may be arranged on the pixel electrode 210 that is at least partially exposed by the pixel definition layer 190. More particularly, the emission layer of the intermediate layer 220 may be arranged on the pixel electrode 210 that is at least partially exposed by the pixel definition layer 190.

A first functional layer may be formed under the emission layer, and a second functional layer may be formed over the emission layer. The first functional layer and the second functional layer respectively arranged under and over the emission layer may be collectively referred to organic functional layers.

The first functional layer may include a hole injection layer (HIL) and/or a hole transport layer (HTL), and the second functional layer may include an electron transport layer (ETL) and/or an electron injection layer (EIL).

The emission layer may include an organic material including a fluorescent or phosphorescent material emitting red, green, blue, or white light. The emission layer may include a low-molecular weight organic material or a high-molecular weight organic material.

When the emission layer includes a low-molecular weight organic material, the intermediate layer 220 may include a structure in which a hole injection layer, a hole transport layer, an emission layer, and an electron transport layer, an electron injection layer, and the like are stacked in a single or complex structure and the low-molecular weight organic material may include various suitable organic materials such as copper phthalocyanine (CuPc), N,N'-di(naphthalene-1-yl)-N,N'-diphenyl-benzidine(NPB), and/or tris-8-hydroxy-quinoline aluminum (Alq3). These layers may be formed by vacuum deposition.

When the emission layer includes a high-molecular weight organic material, the intermediate layer 220 may generally have a structure including a hole transport layer and an emission layer. In this case, the hole transport layer may include poly(3,4-ethylenedioxythiophene) (PEDOT) and the emission layer may include a high-molecular weight material such as poly-phenylene vinylene (PPV) and/or polyfluorene. The emission layer may be formed by screen printing, inkjet printing, laser induced thermal imaging (LITI), or the like.

The opposite electrode 230 may be formed on the intermediate layer 220. The opposite electrode 230 may be formed on the intermediate layer 220 and may be formed to entirely cover the intermediate layer 220. The opposite electrode 230 may be formed over the display area DA and may be formed to entirely cover the intermediate layer 220. That is, by using an open mask, the opposite electrode 230 may be integrally formed over the entire display area to cover a plurality of pixels P arranged in the display area DA.

The opposite electrode 230 may include a conductive material having a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ on the (semi)transparent layer including the above-mentioned material.

According to an embodiment described above, an etchant may not include a phosphoric acid, and the precipitation of silver may be prevented or reduced in the process of etching a multi-layer structure including a silver layer. However, the scope of the present disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An etchant composition comprising:
   an inorganic acid compound of about 8 wt % to about 15 wt %;
   a sulfonic acid compound of about 2.5 wt % to about 8 wt %;
   a sulfate compound of about 6 wt % to about 14 wt %;
   an organic acid compound of about 40 wt % to about 55 wt %;
   a metal or metal salt of about 0.01 wt % to about 0.06 wt %; and
   water.

2. The etchant composition of claim 1, wherein the inorganic acid compound comprises a nitric acid.

3. The etchant composition of claim 1, wherein the sulfonic acid compound comprises at least one of a methanesulfonic acid, an ethanesulfonic acid, or a propanesulfonic acid.

4. The etchant composition of claim 1, wherein the sulfate compound comprises at least one of a potassium hydrogen sulfate, a sodium hydrogen sulfate, or an ammonium hydrogen sulfate.

5. The etchant composition of claim 1, wherein the organic acid compound comprises at least one of an acetic acid, a citric acid, a glycolic acid, a malonic acid, a lactic acid, or a tartaric acid.

6. The etchant composition of claim 1, wherein the metal or metal salt comprises at least one of a ferric nitrate, a ferric sulfate, copper, a copper sulfate, or iron.

7. The etchant composition of claim 1, wherein a wt % ratio of the sulfate compound to the organic acid compound is about 1:4 to about 1:5.

8. The etchant composition of claim 1, wherein the water is about 28 wt % to about 30 wt %.

9. A method of manufacturing a display apparatus comprising a display area and a non-display area, the method comprising:
   forming a thin film transistor on a substrate of the display area;
   forming a planarization layer on the thin film transistor;
   forming an electrode layer on the planarization layer; and
   forming a pixel electrode by etching the electrode layer with an etchant composition, wherein the etchant composition comprises:
   an inorganic acid compound of about 8 wt % to about 15 wt %;
   a sulfonic acid compound of about 2.5 wt % to about 8 wt %;
   a sulfate compound of about 6 wt % to about 14 wt %;
   an organic acid compound of about 40 wt % to about 55 wt %;
   a metal or metal salt of about 0.01 wt % to about 0.06 wt %; and
   water.

10. The method of claim 9, wherein the electrode layer is formed as a multi-layer structure.

11. The method of claim 10, wherein the electrode layer comprises a first conductive layer, a second conductive layer comprising a first metal, and a third conductive layer, and wherein the first conductive layer and the third conductive layer are transparent or semitransparent electrodes.

12. The method of claim 11, wherein the first metal is silver.

13. The method of claim 11, wherein the etchant composition is utilized to etch the first conductive layer, the second conductive layer, and the third conductive layer.

14. The method of claim 11, wherein the etchant composition is utilized to etch the first conductive layer and the second conductive layer.

15. The method of claim 9, further comprising forming a line layer in the non-display area,
wherein the electrode layer is etched by the etchant composition with the line layer exposed.

16. The method of claim 15, wherein the line layer comprises a first line layer comprising a second metal, a second line layer comprising a third metal, and a third line layer comprising the second metal.

17. The method of claim 16, wherein the second metal is titanium, and
wherein the third metal is aluminum.

18. The method of claim 15, wherein the thin film transistor comprises a semiconductor layer, a gate electrode, a source electrode, and a drain electrode, and
wherein the line layer is formed of the same material as the source electrode or the drain electrode.

19. The method of claim 9, further comprising forming an intermediate layer on the pixel electrode and an opposite electrode on the intermediate layer.

20. The method of claim 9, wherein the inorganic acid compound comprises a nitric acid.

21. The method of claim 9, wherein the sulfonic acid compound comprises at least one of a methanesulfonic acid, an ethanesulfonic acid, or a propanesulfonic acid.

22. The method of claim 9, wherein the sulfate compound comprises at least one of a potassium hydrogen sulfate, a sodium hydrogen sulfate, or an ammonium hydrogen sulfate.

23. The method of claim 9, wherein the organic acid compound comprises at least one of an acetic acid, a citric acid, a glycolic acid, a malonic acid, a lactic acid, or a tartaric acid.

24. The method of claim 9, wherein the metal or metal salt comprises at least one of a ferric nitrate, a ferric sulfate, copper, a copper sulfate, or iron.

25. The method of claim 9, wherein a wt % ratio of the sulfate compound to the organic acid compound is about 1:4 to about 1:5.

26. The method of claim 9, wherein the water is about 28 wt % to about 30 wt %.

* * * * *